(12) United States Patent
Mraz et al.

(10) Patent No.: US 7,503,181 B2
(45) Date of Patent: Mar. 17, 2009

(54) QUENCH SEAL

(75) Inventors: Beat Mraz, Bubikon (CH); Urs Meier, Wetzikon (CH); Agnès Glémot, Zurich (CH); Dieter Vogel, Winterthur (CH)

(73) Assignee: Bruker Biospin AG, Faellanden (CH)

( * ) Notice: Subject to any disclaimer, the term of this patent is extended or adjusted under 35 U.S.C. 154(b) by 370 days.

(21) Appl. No.: 11/291,990

(22) Filed: Dec. 2, 2005

(65) Prior Publication Data

US 2008/0092557 A1    Apr. 24, 2008

(30) Foreign Application Priority Data

Jan. 15, 2005   (DE) .................. 10 2005 002 011

(51) Int. Cl.
*F25B 19/00* (2006.01)
(52) U.S. Cl. ........................................ 62/51.1
(58) Field of Classification Search .............. 62/51.1; 137/68.23
See application file for complete search history.

(56) References Cited

U.S. PATENT DOCUMENTS

| | | | | |
|---|---|---|---|---|
| 4,279,127 A | * | 7/1981 | Longsworth | 62/77 |
| 4,633,682 A | * | 1/1987 | Laskaris | 62/51.1 |
| 5,094,084 A | * | 3/1992 | Mraz | 62/51.1 |
| 5,111,665 A | * | 5/1992 | Ackermann | 62/6 |
| 5,249,425 A | * | 10/1993 | Longsworth | 62/6 |
| 5,291,741 A | * | 3/1994 | Grimes | 62/51.1 |
| 5,385,010 A | * | 1/1995 | Horn | 62/6 |
| 5,430,423 A | * | 7/1995 | Herd et al. | 335/216 |
| 5,563,566 A | | 10/1996 | Laskaris | |
| 5,613,367 A | * | 3/1997 | Chen | 62/47.1 |

(Continued)

FOREIGN PATENT DOCUMENTS

EP    0 905 436    3/1999

(Continued)

OTHER PUBLICATIONS

Dirk D. Laukien and Werner H. Tschopp "Superconducting NMR Magnet Design". Concepts in Magnetic Resonance, 1993, 6, 255-273.

*Primary Examiner*—William C Doerrler
(74) *Attorney, Agent, or Firm*—Paul Vincent

(57) ABSTRACT

A cryostat configuration comprising an outer shell and a cryocontainer (2) for cryogenic fluid installed therein, wherein the cryocontainer (2) is connected to the outer shell via at least two suspension tubes (16), and with a neck tube (1) whose upper warm end is connected to the outer shell and whose lower cold end is connected to the cryocontainer (2) and into which a cold head (3) of a multi-stage cryocooler is installed, wherein the outer shell, the cryocontainer (2), the suspension tubes (16) and the neck tube (1) delimit an evacuated space, and wherein the cryocontainer (2) is moreover surrounded by at least one radiation shield which is connected to the suspension tubes (16) and optionally to the neck tube (1) of the cryocontainer (2) in a thermally conducting fashion, is characterized by a seal which can be manually and/or automatically actuated to separate the cold end of the neck tube (1) from the cryocontainer (2) in such a manner that fluid flow between the cryocontainer (2) and the neck tube (1) is minimized or completely interrupted. A cryostat configuration of this type ensures safe installation and removal of a cold head (3) into and from a neck tube (1) of a helium container (2).

27 Claims, 5 Drawing Sheets

U.S. PATENT DOCUMENTS

| | | | |
|---|---|---|---|
| 5,682,751 A * | 11/1997 | Langhorn et al. | 62/51.1 |
| 5,782,095 A | 7/1998 | Chen | |
| 5,884,489 A * | 3/1999 | Retz et al. | 62/51.1 |
| 5,966,944 A | 10/1999 | Inoue | |
| 6,109,042 A * | 8/2000 | Woods et al. | 62/51.1 |
| 6,591,854 B1 * | 7/2003 | Turner et al. | 137/68.23 |
| 2002/0002830 A1 | 1/2002 | Stroebel | |
| 2003/0230089 A1 | 12/2003 | Strobel | |

FOREIGN PATENT DOCUMENTS

| | | |
|---|---|---|
| EP | 0 905 524 | 3/1999 |
| GB | 2 015 716 | 9/1979 |
| WO | WO 03/036190 | 5/2003 |
| WO | WO 03/036207 | 5/2003 |

\* cited by examiner

QUENCH SEAL

This application claims Paris Convention priority of DE 10 2005 002 011.9 filed Jan. 15, 2005 the complete disclosure of which is hereby incorporated by reference.

BACKGROUND OF THE INVENTION

The invention concerns a cryostat configuration, comprising an outer shell and a cryocontainer for cryogenic fluid installed therein, wherein the cryocontainer is connected to the outer shell via at least two suspension tubes, and with a neck tube whose warm upper end is connected to the outer shell and whose cold lower end is connected to the cryocontainer, and which contains a cold head of a multi-stage cryocooler, wherein the outer shell, the cryocontainer, the suspension tubes and the neck tube delimit an evacuated space, wherein the cryocontainer is surrounded by at least one radiation shield which is connected in a thermally conducting fashion to the suspension tubes-and optionally also to the neck tube of the cryocontainer.

A cryostat configuration of this type is disclosed e.g. in U.S. 2002/0002830.

In cryostat configurations of the type, used e.g. in nuclear magnetic resonance (NMR) apparatus, a superconducting magnet coil system is disposed in a first container having a cryogenic liquid, usually liquid helium, which is surrounded by radiation shields, super insulation foils and optionally a further container with cryogenic liquid, usually liquid nitrogen. The liquid containers, radiation shields and super insulation foils are accommodated in an outer container which delimits a vacuum chamber. The superconducting magnet is kept at a constant temperature by the surrounding evaporating helium. The elements surrounding the helium container thermally insulate the container to minimize heat input into the container as well as the helium evaporation rate.

Magnet systems for high-resolution NMR spectroscopy are usually so-called vertical systems, wherein the coil configuration axis and the opening for receiving the NMR sample extend in the vertical direction. The helium container of NMR spectrometers is usually connected to the outer vacuum sleeve via at least two thin-walled suspension tubes. The container is thereby mechanically fixed and the suspension tubes provide access to the magnet as is required e.g. for charging. The waste gas is discharged via the suspension tubes thereby cooling the suspension tubes and, in the ideal case, completely compensating for the heat input via the tube wall. A system of this type is described e.g. in DE 29 06 060 A1 and in the document "Superconducting NMR Magnet Design" (Concepts in Magnetic Resonance, 1993, 6, 255-273).

Mechanical cooling apparatus, so-called cryocoolers, have recently been used to a greater extent for directly cooling superconducting magnet systems. In addition to cooling without cryogenic fluids (dry cooling) there are conventional systems which contain at least one further cryogenic fluid which is, however, reliquefied by the cryocooler after evaporation. For this reason, none or nearly none of the cryogenic fluid escapes to the outside. The documents EP 0 905 436, EP 0 905 524, WO 03/036207, WO 03/036190, U.S. Pat. No. 5,966,944, U.S. Pat. No. 5,563,566, U.S. Pat. No. 5,613,367, U.S. Pat. No. 5,782,095, US 2002/0002830 and US 2003/230089 describe such possible cooling of a superconducting magnet system using a cryocooler without losing cryogen.

The e.g. two-stage cold head of the cryocooler may be installed in a separate vacuum space (as described e.g. in U.S. Pat. No. 5,613,367) or directly in the vacuum space of the cryostat (as described e.g. in U.S. Pat. No. 5,563,566) in such a manner that the first cold stage of the cold head is fixed to a radiation shield and the second cold stage is connected in a thermally conducting fashion to the helium container either directly or indirectly via a fixed thermal bridge. The overall heat input into the helium container can be compensated for through back condensation of the helium, which evaporates due to heat input from the outside, on the cold contact surface in the helium container, permitting loss-free operation of the system. Disadvantageously, the connection between the second cold stage and the helium container has a thermal resistance.

One way to avoid this thermal resistance is to insert the cold head into a neck tube which connects the outer vacuum sleeve of the cryostat to the helium container and is correspondingly filled with helium gas as described e.g. in the document U.S. 2002/0002830. The first cold stage of the two-stage cold head is in fixed conducting contact with a radiation shield. The second cold stage is freely suspended in the helium atmosphere and directly liquefies the evaporated helium.

A superconducting magnet coil can become resistive, i.e. have a measurable electric resistance, e.g. due to slightly shifted wires in the coil packet, causing the overall magnet to quench. During a quench, the magnetic energy stored in the magnet is converted into heat and is suddenly released. In a magnet cooled by liquid helium, a considerable part or the whole amount of liquid thereby evaporates and must be discharged from the first tank to prevent generation of an inadmissibly high pressure which could damage the container. In a conventional cryostat, the quench gas is discharged via the suspension tubes of the helium container and through special safety valves, so-called quench valves, which present a large opening cross-section when the quench pressure is reached.

A quench and the associated sudden escape of the quench gas represent a problem, in particular, if the cooler of a cryogen-loss-free magnet system must be replaced due to a technical defect. In a system with which the cooler is installed in a neck tube which directly connects the outer vacuum sleeve to the helium container, the charged magnet may quench during removal of the cooler, possibly causing injuries to the technician due to cold gases (in the range of approximately 5 K to 100 K) and the quench pressure. For this reason, the magnet must initially be discharged before removal of the cryocooler. After renewed charging of the magnet, it generally takes some time until the magnetic field is stable enough to acquire MR spectra which has the consequence that, in particular, large magnet systems cannot be operated for several days ("downtime").

It is therefore the underlying purpose of the present invention to propose a cryostat configuration which permits safe installation and removal of the cold head without interrupting operation of the system contained in the cryostat configuration, e.g. a magnet system.

SUMMARY OF THE INVENTION

This object is achieved in accordance with the invention by providing a seal which can be manually and/or automatically activated and which separates the cold end of the neck tube from the cryocontainer in such a manner that a fluid flow between the cryocontainer and the neck tube is minimized or completely interrupted.

The inventive seal can be activated before or during installation or removal of the cold head such that possibly escaping gases are no longer discharged via the neck tube, thereby permitting safe mounting or removal of the cold head.

The inventive configuration can be utilized with particular advantage when the cryocontainer contains a superconducting magnet configuration. When these configurations quench, a very large amount of cold gas can escape from the cryocontainer and injure the maintenance staff. The inventive configuration permits safe and quick replacement of the cold head even when the magnet is charged, thereby minimizing the "downtime" of measuring systems containing superconducting magnets.

The inventive cryostat configuration may, in particular, be a configuration with which the superconducting magnet is part of a nuclear magnetic resonance apparatus, in particular, for magnetic resonance imaging (MRI) or magnetic resonance spectroscopy (NMR).

In a cryostat configuration of this type, a safety valve is advantageously provided on at least one suspension tube, which opens in case of a magnet quench to permit escape of the generated gas through the corresponding suspension tubes.

In an advantageous embodiment of the inventive cryostat configuration, the seal has a valve housing which is detachably fixed to the lower end of the neck tube, and a rotatable valve plate mounted thereto which is clamped with a spring. Since the valve housing is detachably mounted to the neck tube, the seal can be easily installed and removed to permit retrofitting in existing cryostat configurations. It is, however, also feasible to initially manufacture the cryostat configuration with a non-detachable seal.

The valve housing and the valve plate advantageously have openings which can be moved into a coinciding working position by turning the rotatable valve plate and which can be completely covered by turning the rotatable valve plate into a removal position. The working position therefore permits unobstructed gas exchange between the neck tube and the cryocontainer, whereas any gas exchange is blocked in the removal position. For this reason, the cold head can be mounted or removed without any danger, even in case of a quench.

In a particular embodiment, the cold head of the cryocooler can freely rotate about its axis, but can be fixed in its working position. The cold head can be removed by turning it into the removal position.

This is particularly advantageous when the rotatable valve plate of the seal comprises at least two carrier elements. The valve plate can then be turned via these elements.

With particular advantage, an actuating element is disposed at the lower end of the cold head of the cryocooler, which engages the carrier elements on the rotatable valve plate of the seal. The position of the valve plate can therefore be changed through rotation of the cold head and the seal can be opened or closed.

In an advantageous embodiment of the invention, the cold head of the cryocooler can be turned to a stop for opening the seal between the neck tube and cryocontainer.

In a further development of this embodiment, after the cold head of the cryocooler is turned to the first stop, the cold head can be turned back into its working position through a defined angle, wherein the actuating element and carrier elements no longer contact each other. This prevents thermal connection and transfer of vibrations between the cold head and neck tube.

In a further development of this embodiment, the cold head of the cryocooler can be turned to a second stop opposite to the first stop for closing the seal between the neck tube and cryocontainer. The valve plate is turned relative to the valve housing during rotation of the cold head in the direction of the second stop, such that the openings no longer coincide, thereby preventing gas exchange between the cryocooler and neck tube of the cryostat configuration.

Moreover, after rotation of the cold head of the cryocooler to the second stop, it is advantageously turned back through a defined angle at which the actuating element is located in a central position between the carrier elements. The actuating element and carrier elements are then no longer in contact, ensuring straightforward removal of the cold head.

In a particularly preferred further development of this embodiment, the cold head of the cryocooler can be removed from the neck tube exclusively in the position turned back through a defined angle (removal position) and is locked in all other positions. This ensures that the cooler can be installed and removed only in a defined (safe) position. On the other hand, installation and removal is not complicated by production tolerances of the components.

In an alternative embodiment of the inventive cryostat configuration, a rotational element is disposed below a suspension tube of the cryocontainer in extension of the axis of the suspension tube in the cryocontainer, which can be turned via an actuating rod which is inserted through the suspension tube, when required. The valve plate is thereby not actuated via the neck tube but via one of the suspension tubes. This is especially advantageous when the cold head of the cooler should not be torsionally loaded or cannot be turned due to lack of space.

In a further development of this embodiment, the valve plate is connected to the rotational element below the suspension tube via a pull rope.

Alternatively, it may be advantageous to connect the valve plate to the rotational element below the suspension tube using a chain.

In a further possible development, the valve plate is connected to the rotational element below the suspension tube via a pull rod and a push rod or via one single pull/push rod.

In a further alternative embodiment, the seal comprises a counter plate which is fixed to the lower end of the neck tube and has an opening, a valve cone, and a valve plate. The valve plate can be moved in the direction of the neck tube axis via a corrugated bellows connected to the counter plate and comprises an opening cross-section which is considerably smaller than the cross-sectional surface of the suspension tubes and safety valves of the cryocontainer. In case of increased pressure in the cryocontainer, the opening of the valve plate is forced against the valve cone thereby separating the gas volume of the neck tube from that of the cryocontainer. This embodiment is particularly advantageous, since the seal must not be manually actuated but is automatically closed in case of a quench.

In a further development of this embodiment, the valve cone is horizontally fixed, pretensioned in a vertical direction by a spring, and movable. This weakens the impact of the valve plate on the valve cone in case of a quench. Moreover, the pressure of the valve parts is defined by the spring force.

It is also advantageous to limit the lift of the valve plate in the direction of the axis of the neck tube by at least one stop element. This prevents excessive compression of the corrugated bellows.

In a further embodiment of the inventive cryostat configuration, the seal consists of one single fixed but detachable plate, which has an opening of predetermined cross-section. The plate may also be connected to the neck tube or cryocontainer in a non-detachable fashion.

The cross-section of the opening is advantageously considerably smaller than the cross-sectional surface of the suspension tubes and safety valves of the cryocontainer. This ensures that only a small part of quench gas escapes through the neck tube.

In a further development of this embodiment, the opening is disposed in the plate in such a manner that, in case of a quench, the gas flow enters the neck tube in the direction of the neck tube. This can be realized in a particularly simple manner.

In another particularly advantageous alternative further development, the opening in the plate is designed in such a manner that quench gas flow enters the neck tube transversely to the neck tube direction. The escaping gas can therefore flow out of the neck tube via its entire cross-section.

The inventive cryostat configuration moreover permits arbitrary combination of a seal which can be manually activated and a seal which can be automatically activated.

The cryogenic liquid located in the cryocontainer is advantageously liquid helium. It is, however, also feasible to use other cryogenic liquids than helium for cooling future magnet systems, e.g. liquid neon or liquid nitrogen. The normal boiling temperatures of these substances are higher than that of helium but sufficiently low to use e.g. high-temperature superconductors for magnet wires. In case of a magnet quench, cold neon or cold nitrogen would be released.

Further advantages of the invention can be extracted from the description and the drawings. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIG. 1ib shows a schematic top view of the seal of FIG. 1a;

DESCRIPTION OF THE PREFERRED EMBODIMENT

Figure 1A:
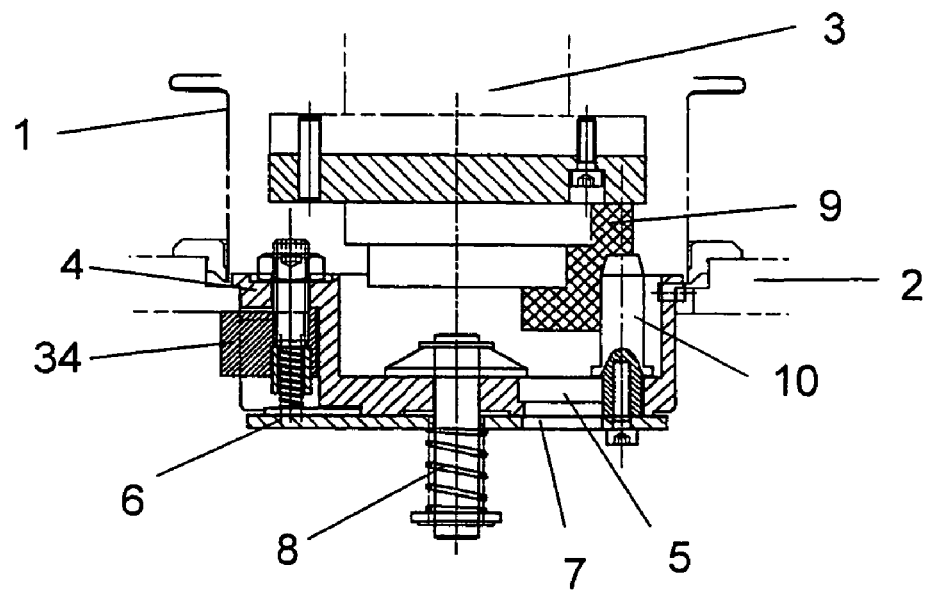
FIG. 1a shows a schematic side view of the seal installed into a neck tube of an inventive cryostat configuration, and comprising a rotatable valve plate.
Figure 1B:
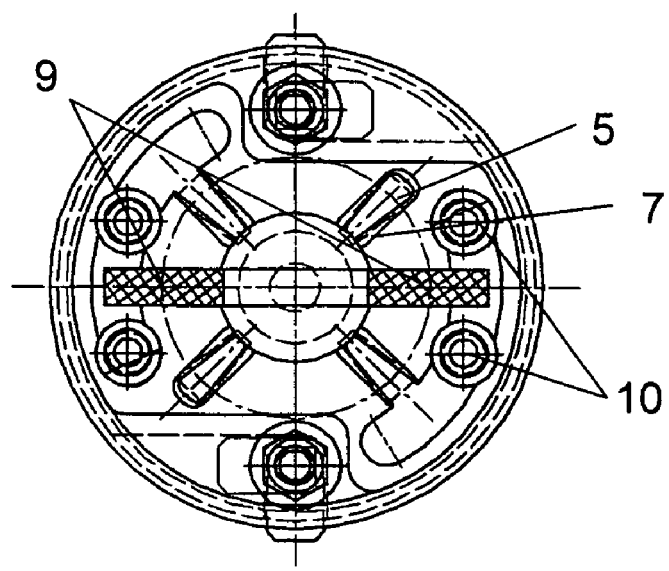

FIG. 1a shows a section of a cryostat configuration having a cryocooler cold head 3 which is disposed in a neck tube 1 of a cryocontainer 2. A metallic valve housing 4 is fixed to the cold lower end of the neck tube 1, which has openings 5, e.g. in the form of bores or slots (FIG. 1b). A movable metallic valve plate 6 is disposed below the valve housing 4 with openings 7 which approximately coincide with the openings of the valve housing 4. The valve plate 6 is pressed onto the valve housing 4 by a spring 8 (FIG. 1a) and no further sealing material is provided between the valve plate 6 and the valve housing 4. By turning the valve plate 6, the openings 7 of the valve plate 6 can be moved such that they coincide with the openings 5 of the valve housing 4 to permit free gas exchange between neck tube 1 and cryocontainer 2. Conversely, the openings 5, 7 can be closed through turning the valve plate 6. In this case, gas exchange between cryocontainer 2 and neck tube 1 is no longer possible except for the minimum leakage through the narrow gap between valve plate 6 and valve housing 4. The valve housing 4 can be mounted to the neck tube opening in the cryocontainer 2 using special locking elements 34, and is connected thereto in a detachable manner and not fixed (welded or soldered). In this manner, the entire seal can be easily disassembled and installed and existing cryostat configurations can optionally be retrofitted.

Figure 2A:
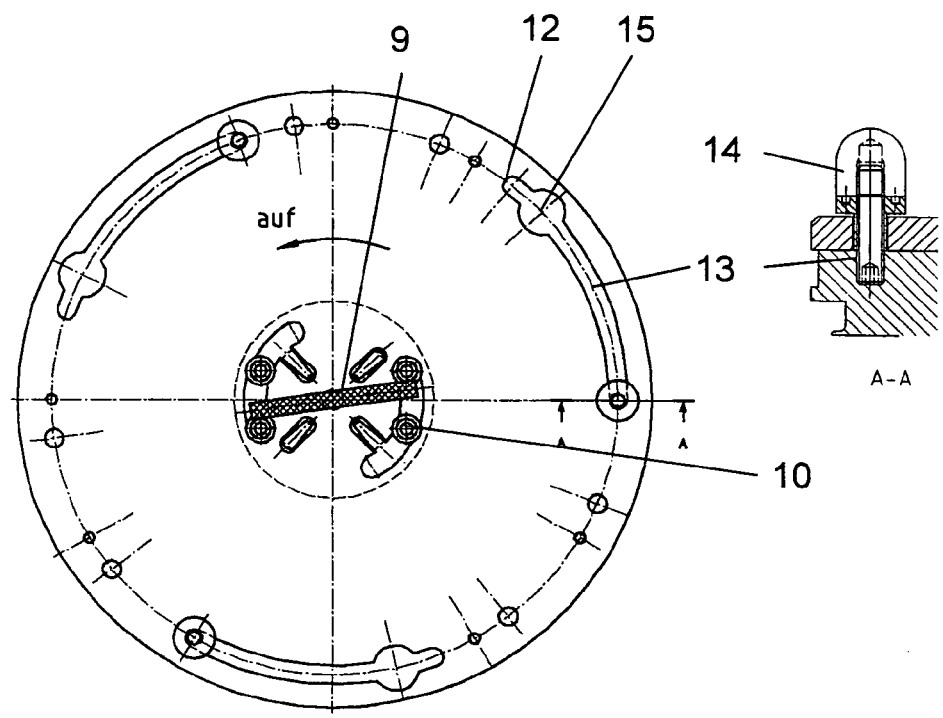
FIG. 2a shows a schematic top view of the neck tube and seal of a first embodiment of the inventive cryostat configuration, wherein a carrier element and the actuating element are positioned at the first stop (valve open)
Figure 2B:
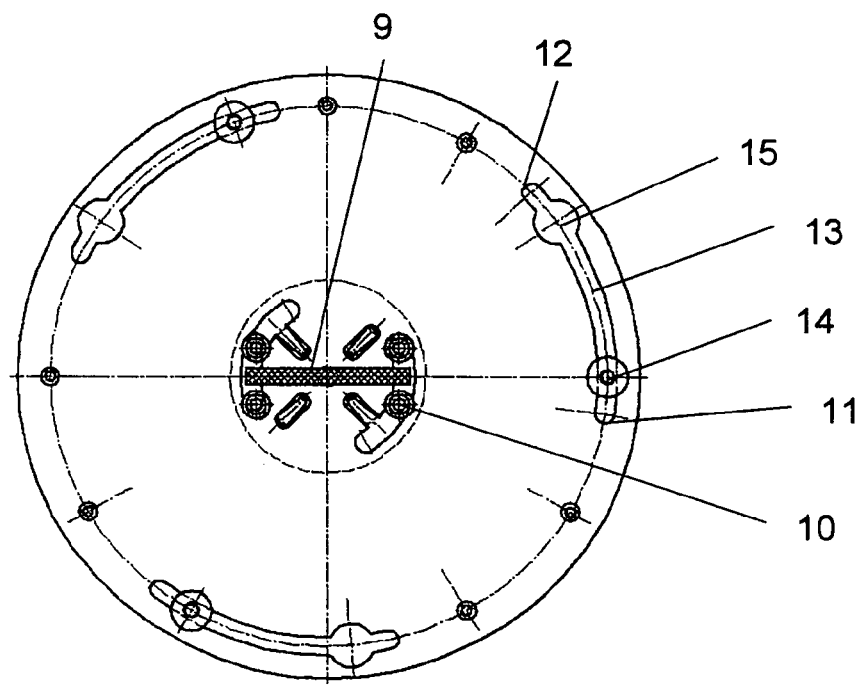
FIG. 2b shows a schematic top view of the neck tube and seal of a first embodiment of the inventive cryostat configuration, wherein the carrier elements and the actuating element are positioned in the working position (valve open, vibrationally decoupled)
Figure 2C:
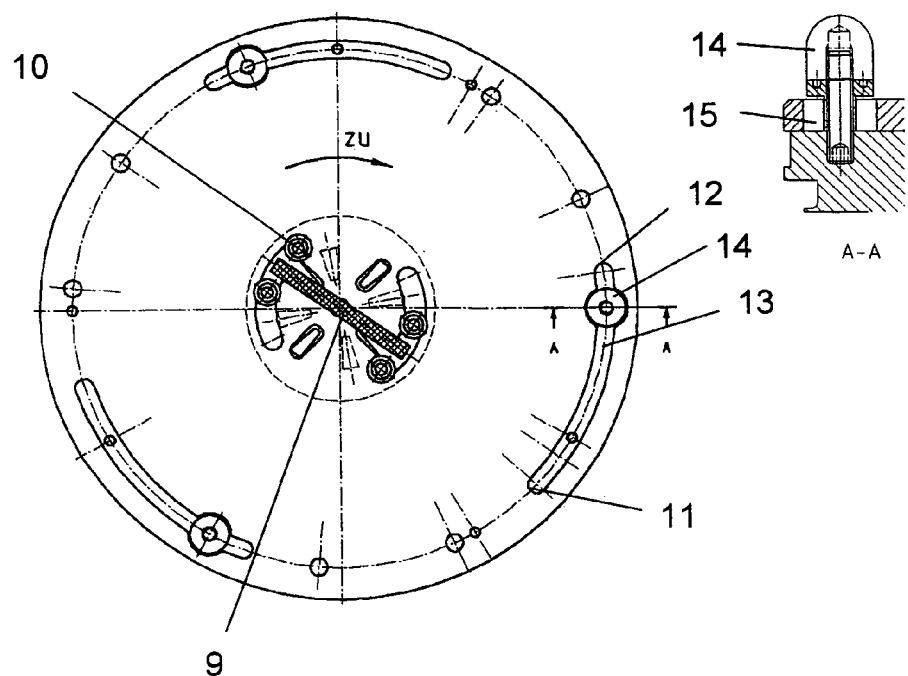
FIG. 2c shows a schematic top view of the neck tube and seal of a first embodiment of the inventive cryostat configuration, wherein the carrier elements and the actuating element are positioned in the removal position (valve closed)

The cold head 3 of the cryocooler which is located in the neck tube 1 can be freely turned in the neck tube 1 after releasing the locking, wherein it is still vertically guided. An actuating element 9 is mounted to the lower cold end of the cold head 3 which engages a carrier element 10 on the valve plate 6 such that the position of the valve plate 6 can be changed through rotation of the cold head 3. FIGS. 2a-c show the carrier elements 10 and the actuating element 9 in different positions. The seal is completely opened when the cold head 3 is turned to a first stop 11 (FIG. 2a). The cold head 3 must then be turned back through a small predetermined angle to prevent contact between the actuating element 9 and carrier elements 10, thereby preventing a thermal bridge between cold head 3 and neck tube 1, as well as transmission of disturbances and vibrations from the cold head 3 to the neck tube 1 and indirectly also to the cryocontainer 2. The cold head 3 is then in its working position (FIG. 2b). If the gas volume of the neck tube 1 is to be separated from that of the cryocontainer 2, the cold head 3 is turned in the other direction to the second stop 12. The cold head 3 is subsequently turned back through a small angle into the removal or installation position (FIG. 2c). The actuating element is then in a central position between the carrier elements, wherein this central position need not be exactly in the center between the carrier elements. It must merely be ensured that measuring deviations due to production tolerances of the components do not aggravate installation and that the actuating element 9 and the carrier elements 10 do not contact each other. The cold head 3 is no longer locked in the removal or installation position and can be easily removed from the neck tube 1. Locking or release of the cold head 3 may be realized e.g. through one or more guiding gaps 13 which are disposed on the upper installation flange of the cold head 3 and extend in the circumferential direction, and in which a stop element 14 is guided which tapers in the region of the guiding slot, wherein the guiding gaps have an opening 15 at that location where the stop element is in the removal position of the cold head 3, through which the stop element 14 can be guided to remove the cold head 3. If a quench occurs exactly at the time when the cold head 3 is removed, there will only be a very small quench gas flow through the narrow gaps between valve plate 6 and valve housing 4 which does not represent any danger to the technician. The described configuration is particularly safe, since the cold head 3 of the cryocooler can be disassembled only when the seal is actually closed.

Figure 3:
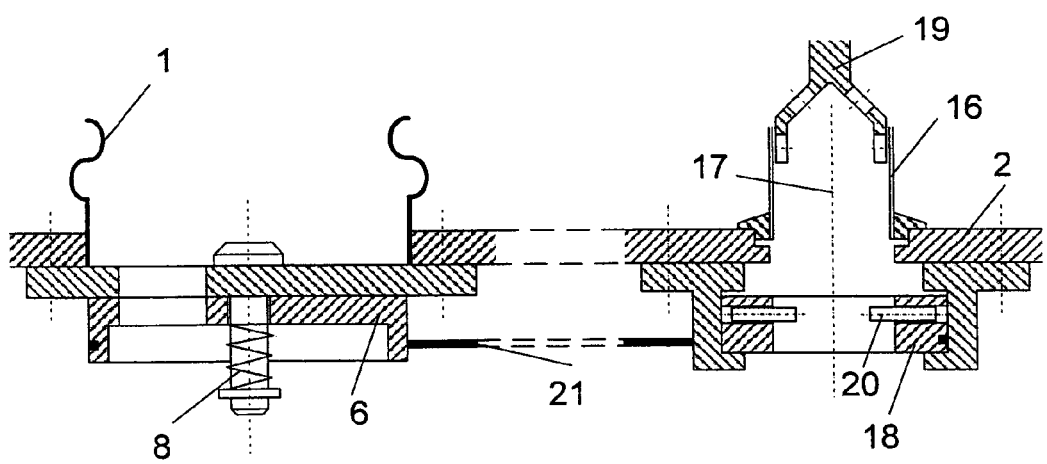
FIG. 3 shows a schematic sectional view of the neck tube, one suspension tube and seal of a second embodiment of the inventive cryostat configuration with an actuating mechanism in the suspension tube of the cryocontainer.

Alternatively, the valve plate 6 can also be actuated via a mechanism in the suspension tube 16 of the cryocontainer 2 (FIG. 3). Towards this end, a disk-shaped rotational element 18 is disposed below a suspension tube 16 in extension of the axis 17 of the suspension tube 16. It can be actuated via a special actuating rod 19 which is inserted into the suspension tube 16 and engages pins 20 disposed on the rotational element 18. After operation, the actuating rod 19 can be removed from the suspension tube 16. The rotational element 18 is connected to the valve plate 6 disposed below the neck tube 1 via either a pull rope 21 or chain, two rods (one pull rod and one push rod) or only one rod (which is alternately pulled or pushed). The rope 21 can be fixed to the rotational element 18 and the valve plate 6 via a clamping connection such that the rotary motion of the actuating rod 19 is transferred from the rotational element 18 to the valve plate 6. To ensure that the seal is completely open or completely closed, the rotational element 18 or also the valve plate may comprise corresponding stops. This method for actuating the valve plate 6 is particularly advantageous when the cold head 3 of the cryocooler is not suitable as an actuating element, due to the fact that it should not be torsionally loaded or since the cold head cannot be turned due to lack of space.

Figure 4:
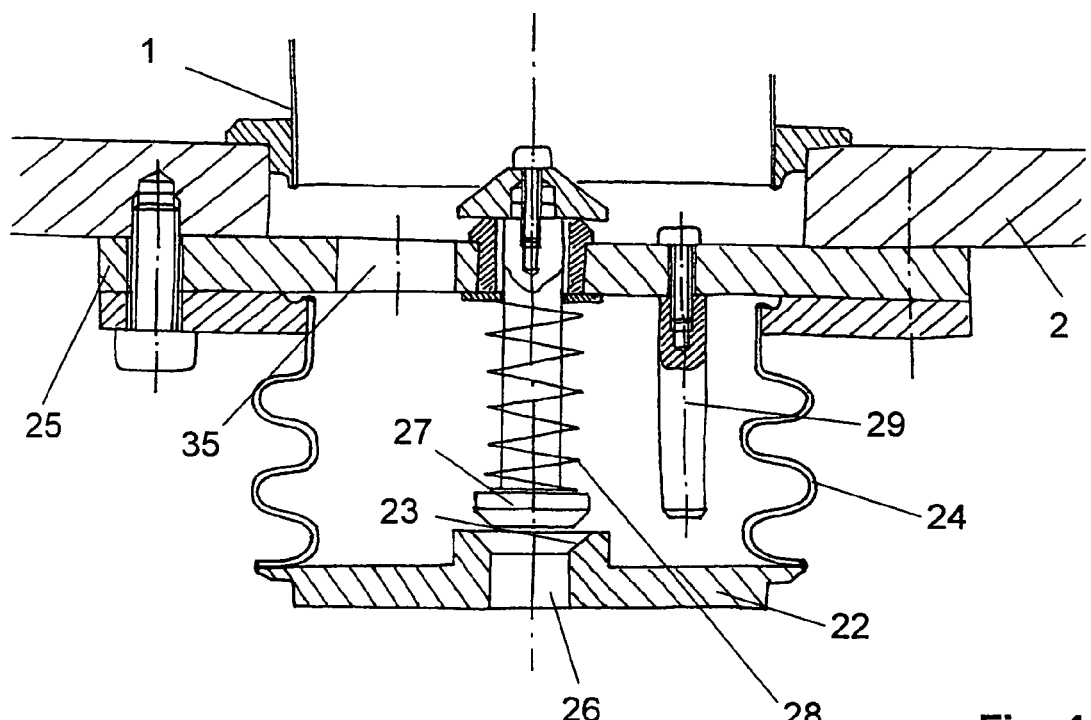
FIG. 4 shows a schematic sectional view of a self-activating seal.

A further embodiment of the inventive cryostat configuration comprises a seal which automatically closes in case of a quench (FIG. 4). A valve plate 22 with valve seat 23 and opening 26 is connected via a corrugated bellows 24 to a counter plate 25 which is mounted to the lower end of the neck tube 1 and has an opening 35. The valve plate 22 can therefore be vertically moved, permitting only minimum motion in the horizontal direction. The opening 26 in the valve plate 22 acts as throttle to form a pressure difference over the valve plate 22 in case of a quench. The valve plate 22 thereby moves in the direction of a valve cone 27 which is positioned on the counter plate 25 and is not fixed in a vertical direction but is pretensioned by a spring 28. When the valve plate 22 and valve cone 27 abut, the gas volume of the neck tube 1 is separated from that of the cryocontainer 2. Since the valve cone 27 is not fixed, the valve plate 22 can move upward in dependence on the quench pressure until it is supported on three stop elements 29. These protect the corrugated bellows 24 from inadmissible compression. The spring 28 moreover defines the contact pressure between valve seat 23 and valve cone 27.

Figure 5:
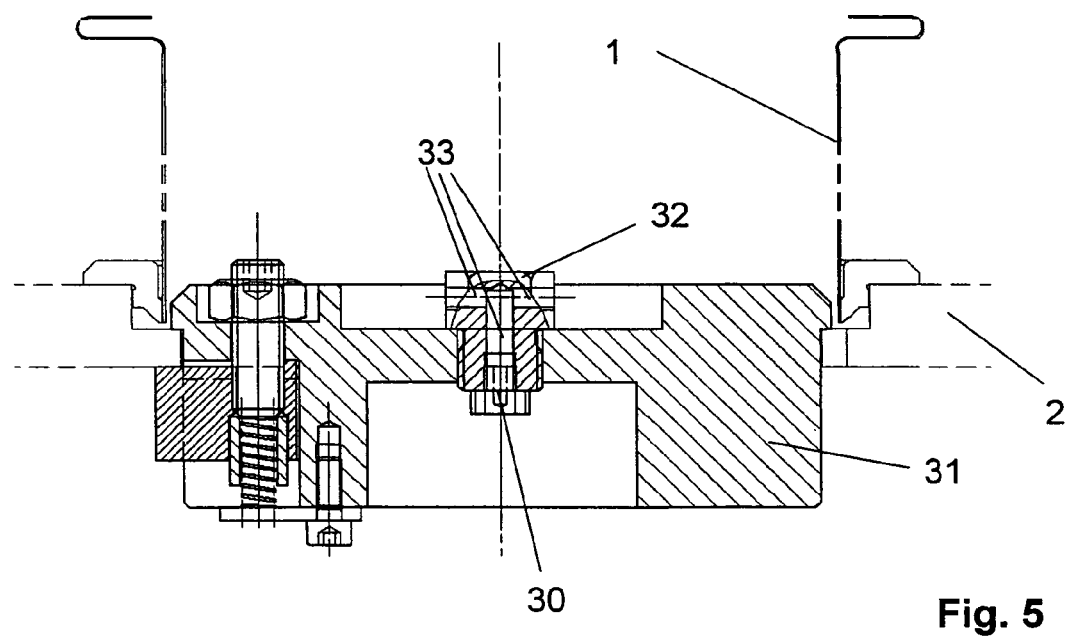
FIG. 5 shows a schematic sectional view of a seal which is fixed in a neck tube of a cryostat configuration and has a defined opening.

Finally, one embodiment without an actual sealing mechanism also meets the required purpose (FIG. 5). An opening 30 in a plate 31 separating the cryocontainer 2 from the neck tube 1 is sufficiently small that, in case of a quench, only a small part of the quench gas flows through the neck tube 1 and the major part thereof is discharged via suspension tubes of the cryocontainer 2. The opening 30 must only be sufficiently large that, during normal operation, the vapor of the cryogen can pass from the cryocontainer 2 into the neck tube 1 and can be liquefied at the cold head 3 of the cryocooler. The liquefied cryogen returns in counter flow relative to the vapor, from the neck tube 1 into the cryocontainer 2. The vapor escaping in case of a quench can also be prevented from flowing in a vertical upward direction through the neck tube 1 by providing a flow baffle plate. Instead, it is guided towards the neck tube wall, is thereby whirled and leaves the neck tube 1 throughout the entire cross-section. This could be realized e.g. using a pin 32 which is screwed into the opening 30 of the plate 31 and has a blind hole in the direction of the axis in the lower region, and a through bore 33 in the upper region (FIG. 5) perpendicular thereto.

Figure 6:
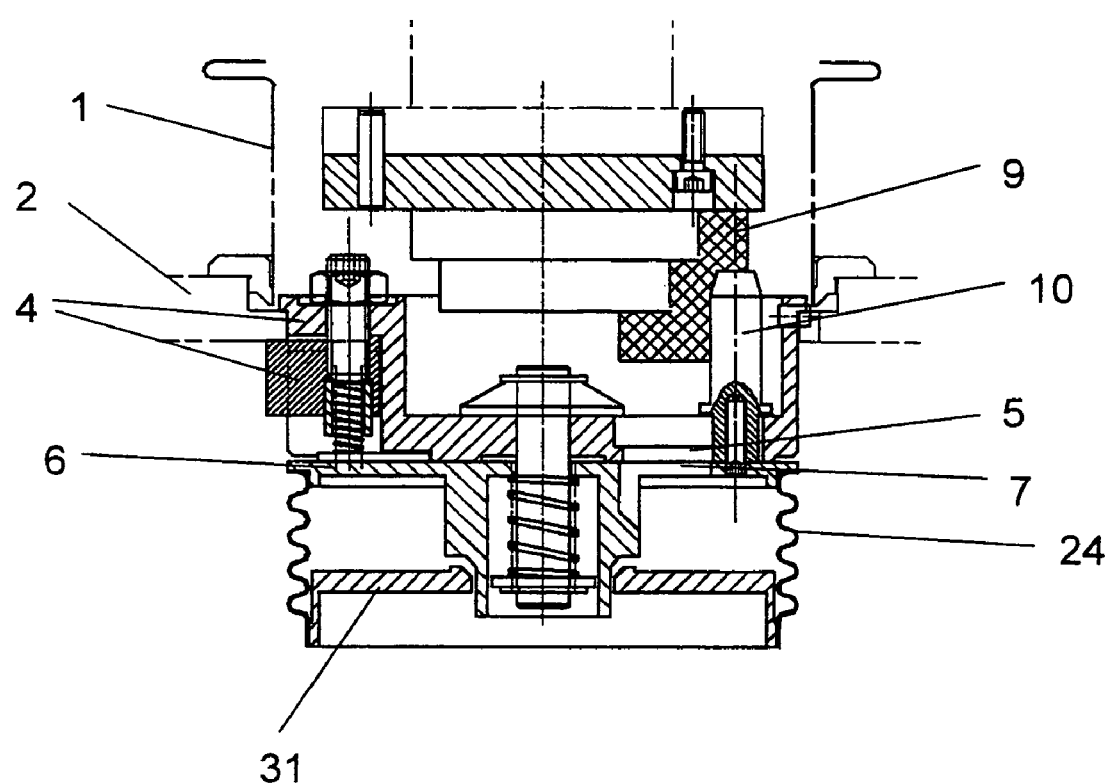
FIG. 6 shows a schematic view of a further embodiment of the inventive configuration with a combined manually and automatically activated seal.

FIG. 6 shows an embodiment of the invention, combining seals which can be manually and automatically activated. The automatic seal is thereby disposed below the manually activated seal to permit activation of the manual seal via the neck tube. Other configurations or possible combinations of the above-described embodiments are also possible. A design of this type can additionally increase the safety of the system.

All embodiments of the present invention permit installation and removal of a cold head into and from a neck tube of a cryocontainer without any danger.

List of Reference Numerals
1 neck tube
2 cryocontainer
3 cold head
4 valve housing
5 openings of the valve housing
6 rotatable valve plate
7 openings of the valve plate
8 spring
9 actuating element
10 carrier element
11 first stop
12 second stop
13 guiding gap
14 stop element
15 opening in the guiding gap
16 suspension tube
17 axis of the suspension tube
18 rotational element
19 actuating rod
20 pin
21 pull rope
22 valve plate
23 valve seat
24 corrugated bellows
25 counter plate
26 opening of the valve plate
27 valve cone
28 spring
29 stop elements
30 opening in the plate
31 plate
32 pin
33 bore
34 locking element
35 opening of the counter plate

We claim:
1. A cryostat configuration containing a cryogenic fluid, the configuration comprising:
an outer shell;
a cryogenic container disposed within said outer shell and holding the cryogenic fluid;
at least two suspension tubes connected between said cryogenic container and said outer shell;
a neck tube, said neck tube having an warm upper end connected to said outer shell and a cold lower end connected to said cryogenic container;
a multi-stage cryogenic cooler, said cryogenic cooler having a cold head installed within said neck tube, wherein said outer shell, said cryogenic container, said suspension tubes, and said neck tube delimit an evacuated space;
at least one radiation shield surrounding said cryogenic container and connected to said suspension tubes and optionally to said neck tube in a thermally conducting fashion; and
a seal, which can be manually and/or automatically activated to separate said cold end of said neck tube from said cryogenic container, thereby minimizing or com- pletely interrupting fluid flow between said cryogenic container and said neck tube,
wherein said seal has a working position that permits fluid flow and a working position that stops fluid flow.

2. The cryostat configuration of claim 1, wherein said cryogenic container contains a superconducting magnet configuration.

3. The cryostat configuration of claim 2, wherein said superconducting magnet configuration is part of a nuclear magnetic resonance apparatus, a magnetic resonance imaging apparatus (MRI), or a magnetic resonance spectroscopy apparatus (NMR).

4. The cryostat configuration of claim 2, further comprising a safety valve disposed on at least one suspension tube to open in response to a magnet quench.

5. The cryostat configuration of claim 1, wherein said seal comprises a valve housing which is detachably fixed to said lower end of said neck tube, and a rotatable valve plate mounted thereto, wherein said valve housing and said valve plate are both loaded by a spring.

6. The cryostat configuration of claim 5, wherein said valve housing and said valve plate each have openings which can be moved into an aligned working position by turning said rotatable valve plate and which can be completely covered in a removal position by turning said rotatable valve plate.

7. The cryostat configuration of claim 1, wherein said cold head of said cryogenic cooler can freely rotate to a given angle about an axis thereof and can be fixed in a working position thereof.

8. The cryostat configuration of claim 5, wherein said rotatable valve plate of said seal comprises at least two carrier elements.

9. The cryostat configuration of claim 8, wherein a first actuating element is disposed on said lower end of said cold head to engage in carrier elements on said rotatable valve plate.

10. The cryostat configuration of claim 9, wherein said cold head can be turned to a first stop for opening said seal.

11. The cryostat configuration of claim 10, wherein, after rotation of said cold head to said first stop, said cold head can be turned back through a defined angle and into a working position in which said first actuating element and said carrier elements no longer contact each other.

12. The cryostat configuration of claim 10, wherein said cold head can be turned to a second stop, for closing said seal, said second stop disposed opposite to said first stop.

13. The cryostat configuration of claim 12, wherein, after rotation of said cold head to said second stop, said cold head can be turned back through a defined angle, wherein said first actuating element is in a central position between said carrier elements.

14. The cryostat configuration of claim 13, wherein said cold head can be removed from said neck tube exclusively in a removal position thereof which turned back through said defined angle, said cold head being locked in all other positions.

15. The cryostat configuration of claim 5, wherein a rotational element is disposed below one said suspension tube in extension of an axis of said suspension tube and can be turned via an actuating rod inserted through said suspension tube, thereby inducing rotation of said rotatable valve plate.

16. The cryostat configuration of claim 15, wherein said rotatable valve plate is connected to said rotational element below said suspension tube via a pull rope.

17. The cryostat configuration of claim 15, wherein said rotatable valve plate is connected to said rotational element below said suspension tube via a chain.

18. The cryostat configuration of claim 15, wherein said rotatable valve plate is connected to said rotational element below said suspension tube via a pull rod and a push rod or via one single pull/push rod.

19. The cryostat configuration of claim 4, wherein said seal comprises a counter plate fixed to said lower end of said neck tube and having an opening, and with a valve cone and a valve plate which can be moved towards a neck tube axis via a corrugated bellows connected to said counter plate, said valve plate having an opening cross-section which is considerably smaller than a cross-sectional area of said suspension tubes and said safety valve.

20. The cryostat configuration of claim 19, wherein said valve cone is horizontally fixed, is pre-tensioned in a vertical direction, and can be moved in the vertical direction via a spring.

21. The cryostat configuration of claim 19, wherein a lift of said valve plate in a direction towards said neck tube axis Is limited by at least one stop element.

22. The cryostat configuration of claim 4, wherein said seal consists essentially of one single fixed, but detachable plate having a plate opening of predetermined cross-section.

23. The cryostat configuration of claim 22, wherein a cross-section of said plate opening is considerably smaller than cross-sectional areas of said suspension tubes and said safety valve.

24. The cryostat configuration of claim 22, wherein said plate opening is disposed such that, in case of a quench, a gas flow enters said neck tube in a direction of extension of the neck tube.

25. The cryostat configuration of claim 22, wherein said plate opening is designed in such a manner that, in case of a quench, gas flow enters said neck tube transversely to a neck tube extension.

26. The cryostat configuration of claim 1, wherein said seal comprises a first seal which can be manually actuated and a second a seal which can be automatically actuated.

27. The cryostat configuration of claim 1, wherein the cryogenic fluid in said cryogenic container is helium.

* * * * *